(12) United States Patent
Chen et al.

(10) Patent No.: US 7,892,868 B2
(45) Date of Patent: Feb. 22, 2011

(54) LED PACKAGING METHOD USING A SCREEN PLATE

(75) Inventors: Ming-Yen Chen, Taichung County (TW); Fan-Hsiu Wei, Taichung County (TW); Feng-Kuan Chen, Taichung County (TW); Sheau-Wen Wu, Taichung County (TW); Yueh-Hsia Chiu, Taichung County (TW)

(73) Assignee: Genius Electronic Optical Co., Ltd., Taichung County (TW)

( * ) Notice: Subject to any disclaimer, the term of this patent is extended or adjusted under 35 U.S.C. 154(b) by 318 days.

(21) Appl. No.: 12/195,116

(22) Filed: Aug. 20, 2008

(65) Prior Publication Data

US 2010/0047935 A1    Feb. 25, 2010

(51) Int. Cl.
*H01L 21/44* (2006.01)

(52) U.S. Cl. .................. 438/26; 438/106; 438/112; 438/127; 257/E25.032

(58) Field of Classification Search ............. 438/26–29, 438/106–107; 257/E25.032
See application file for complete search history.

(56) References Cited

U.S. PATENT DOCUMENTS 7,655,486 B2 *    2/2010    Thompson et al. ............ 438/25

* cited by examiner

*Primary Examiner*—H. Jey Tsai
(74) *Attorney, Agent, or Firm*—Browdy and Neimark, PLLC

(57) ABSTRACT

A LED packaging method includes a procedure of placing a screen plate having stepped holes on a substrate carrying LED chips, a procedure of reversing the screen plate with respect to the substrate, and a procedure of packaging the LED chips with a first packaging adhesive and a second packaging adhesive by means of applying the first packaging adhesive to the small diameter portion of each stepped hole when the first side of the screen plate is attached to the substrate and then applying the second packaging adhesive to the big diameter portion of each stepped hole after the screen plate is reversed.

9 Claims, 10 Drawing Sheets

LED PACKAGING METHOD USING A SCREEN PLATE

BACKGROUND OF THE INVENTION

1. Field of the Invention

The present invention relates to LED packaging technology and more particularly, to a LED packaging method using a screen plate, which simplifies LED package manufacturing process, raises LED package production efficiency, and reduces the related equipment cost.

2. Description of the Related Art

The fabrication of a LED package includes a procedure of packaging a LED chip with a fluorescent adhesive. The fluorescent adhesive packaging procedure may be achieved by means of a dot gluing or casting procedure. Applying a dot gluing procedure to package LED chips may encounter the problems of dimension error and adhesive displacement. A casting procedure eliminates the problems of dimension error and adhesive displacement, however it tends to cause a stress, resulting in an imperfect contact between the LED chip and a substrate or falling of the LED chip from the substrate. Further, the equipment cost for casting packaging is high.

In view of the aforesaid drawbacks, a screen-printing technique is created to apply a fluorescent adhesive to LED chips. A screen plate for this purpose has multiple through holes made subject to a predetermined dimension to limit the applied packaging adhesive. This method improves packaging accuracy and quality of emitted light. Further, a screen-printing packaging method has the advantages of low cost and fast production speed. Because a screen-printing packaging method eliminates the problem of stress, it has high reliability.

Although a LED package made by means of the aforesaid conventional screen-printing packaging method has optimal light output quality and reliability, the aforesaid conventional screen-printing package method is insufficient to satisfy advanced LED package designs. For packaging a LED package having multiple fluorescent adhesive layers and light transmissive layers, different screen plates of different mesh sizes must be used in a proper order to print a respective layer. This manufacturing process is complicated, increasing the equipment cost and lowering the production efficiency and having less economic effect.

SUMMARY OF THE INVENTION

The present invention has been accomplished under the circumstances in view. It is the main object of the present invention to provide a LED packaging method using a screen plate, which simplifies LED package manufacturing process, raises LED package production efficiency, and reduces the related equipment cost. It is another object of the present invention to provide a LED packaging method, which satisfies the requirements for packaging of different designs of LED packages.

To achieve these and other objects of the present invention, the LED packaging method includes a procedure of placing a screen plate having at least one stepped hole on a substrate carrying at least one LED chip, and a procedure of reversing said screen plate with respect to said substrate. Each stepped hole has a big diameter portion and a small diameter portion. The LED packaging method further includes a procedure of packaging said at least one LED chip with a first packaging adhesive and a second packaging adhesive by means of applying the first packaging adhesive to the small diameter portion of each stepped hole and then applying the second packaging adhesive to the big diameter portion of each stepped hole after said screen plate is reversed.

BRIEF DESCRIPTION OF TILE DRAWING

FIGS. 1~6 are schematic drawings showing the operation flow of a LED packaging method in accordance with a first embodiment of the present invention.

FIGS. 7~11 are schematic drawings showing the operation flow of a LED packaging method in accordance with a second embodiment of the present invention.

FIGS. 12~16 are schematic drawings showing the operation flow of a LED packaging method in accordance with a third embodiment of the present invention.

FIGS. 17~20 are schematic drawings showing the operation flow of a LED packaging method in accordance with a fourth embodiment of the present invention.

DETAILED DESCRIPTION OF THE INVENTION

Figure 1:
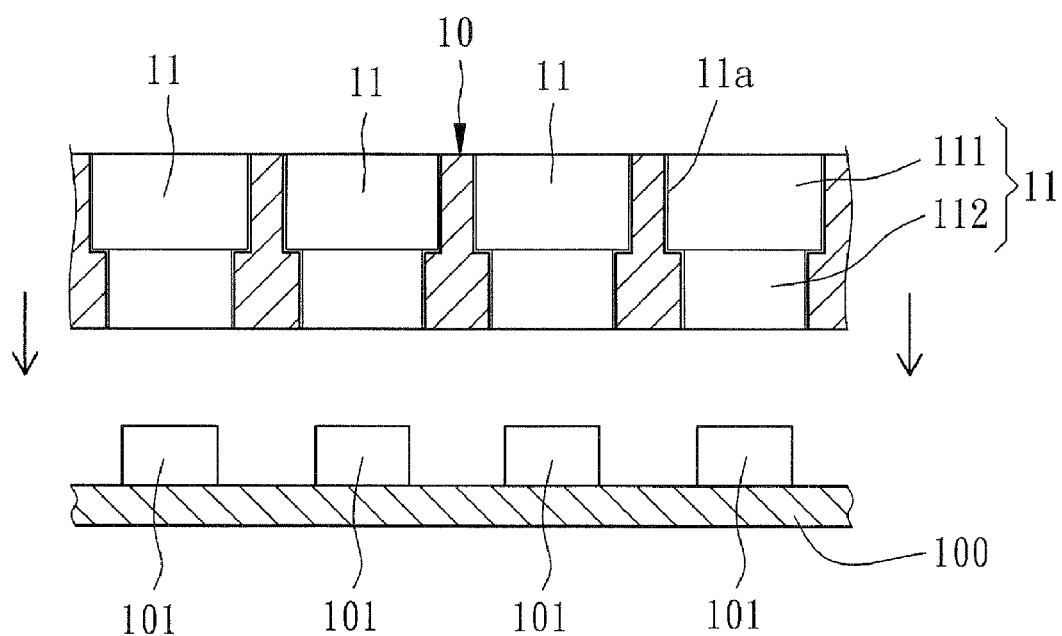

Referring to FIGS. 1~6, a LED packaging method using a screen plate in accordance with a first embodiment of the present invention includes the following steps:

At first, preparing a screen plate 10. As illustrated in FIG. 1, the screen plate 10 has a plurality of stepped holes 11. Each stepped hole 11 has a big diameter portion 111 and a small diameter portion 112. The peripheral walls of the stepped holes 11 are processed through a surface treatment. According to this embodiment, the peripheral wall of each stepped hole 11 is coated with a layer of a nonstick coating 11a to facilitate stripping.

Figure 2:
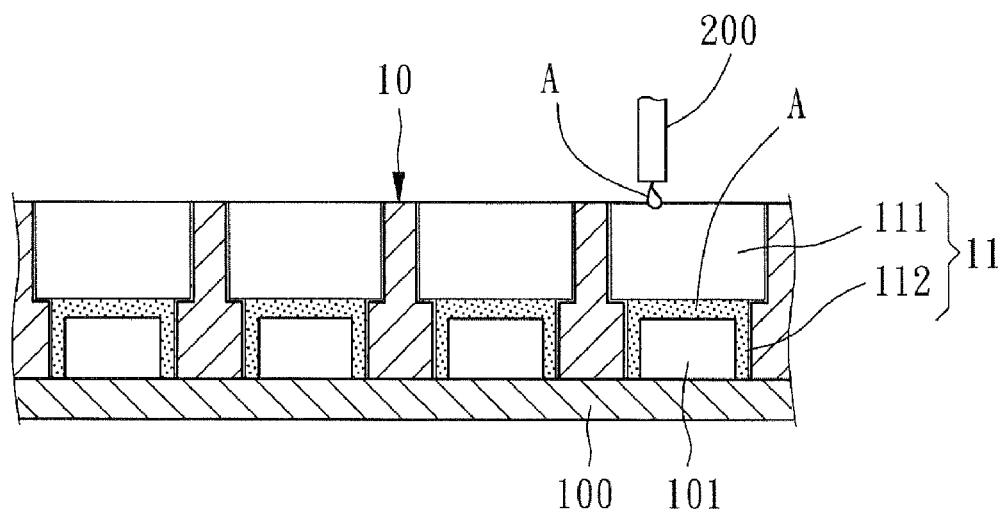

Thereafter, as shown in FIG. 2, place the screen plate 10 on a substrate 100 that carries a plurality of LED chips 101, keeping the LED chips 101 in the small diameter portions 112 of the stepped holes 11 respectively. Thereafter, operating a gluing machine 200 to apply a first packaging adhesive A (for example, light transmissive fluorescent adhesive) through the big diameter portion 111 of the stepped holes 11 in the respective small diameter portions 112 to cover the LED chips 101 wholly subject to predetermined gluing amount and locations. After packaging the LED chips 101 with the first packaging adhesive A, run a curing process to cure the first packaging adhesive A.

Figure 3:
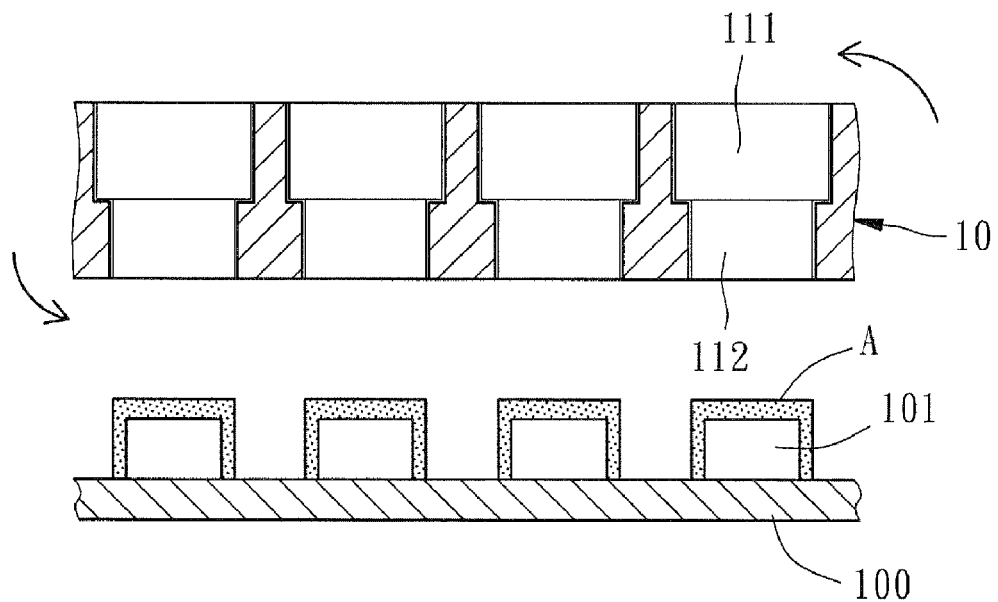
Figure 4:
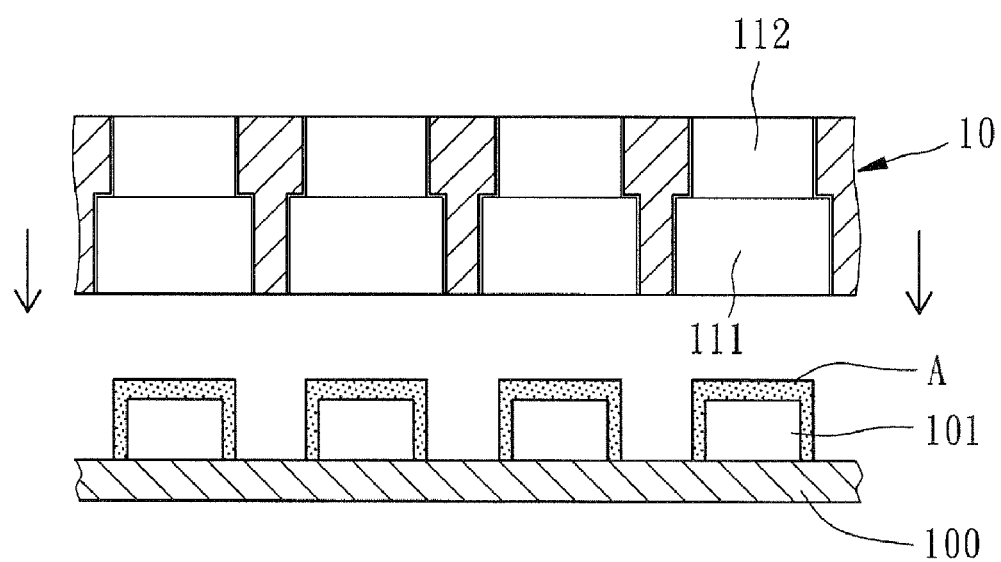
Figure 5:
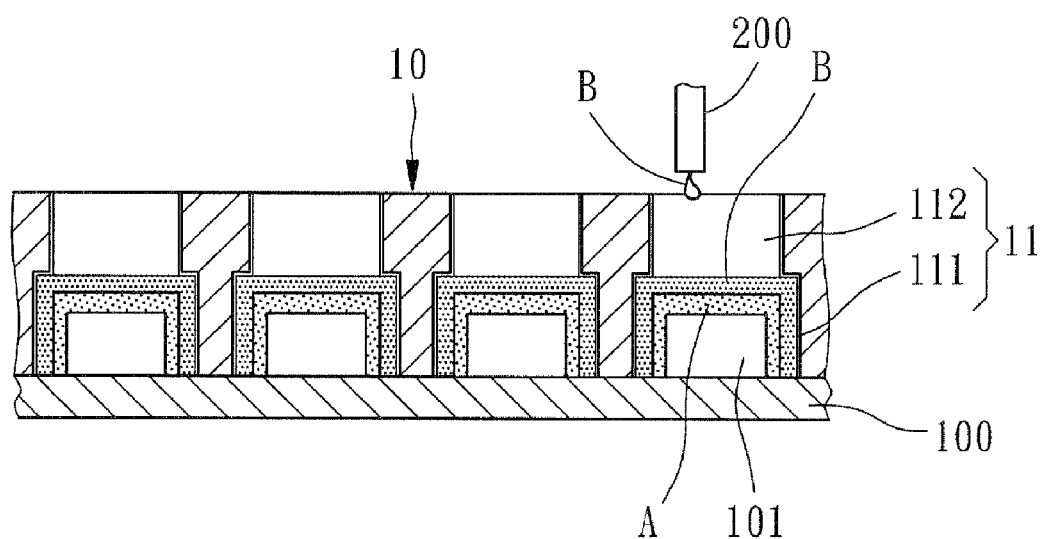
Figure 6:
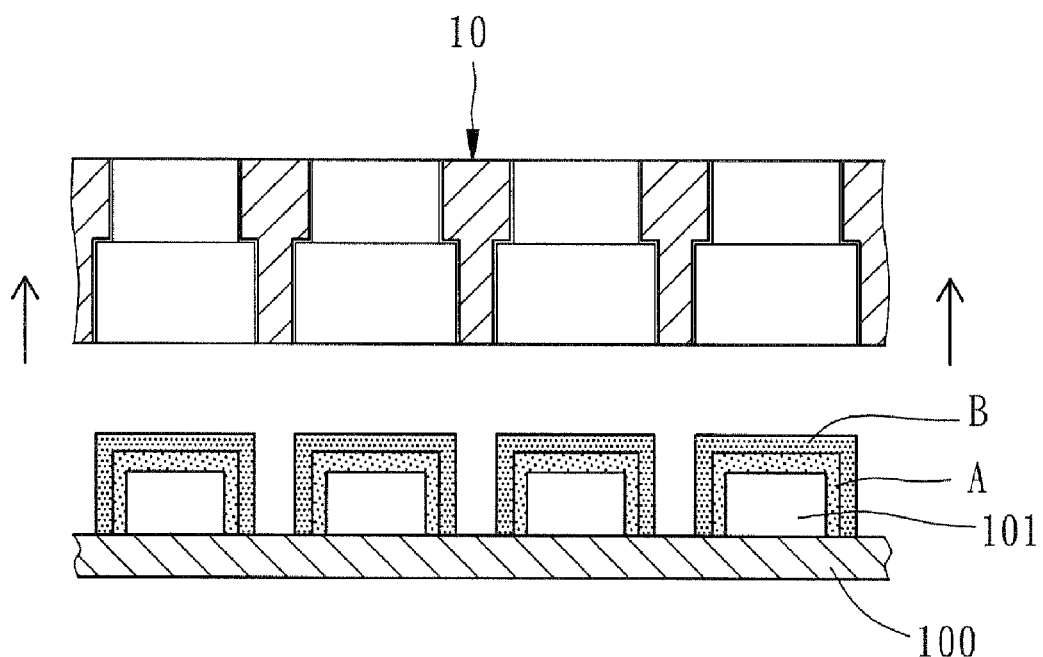
Figure 7:
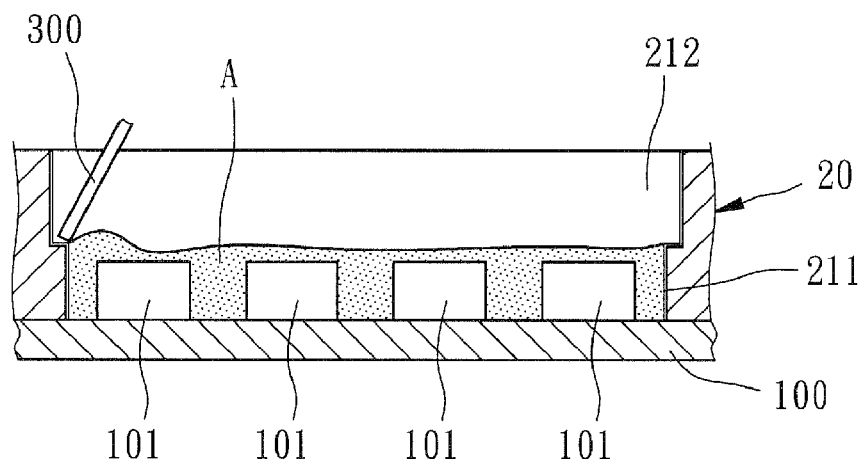

After curing of the first packaging adhesive A, lift the screen plate 10 from the substrate 100 and then turn the screen plate 10 upside down, as shown in FIGS. 3 and 4, and then lower the screen plate 10 to the substrate 100, as shown in FIG. 5. At this time, operate the gluing machine 200 to apply a second packaging adhesive B (for example, silicon adhesive) through the small diameter portions 112 of the stepped holes 11 into the big diameter portion 111, enabling the applied second packaging adhesive B to be covered on the cured first packaging adhesive A. Thereafter, apply a heating process to cure the second packaging adhesive B, and then remove the screen plate 10 from the substrate 100, as shown in FIG. 6. Thus, the LED packaging procedure is done.

As stated above, by means of inverting the screen plate 10 to reverse the direction of the stepped holes 11, the screen plate 10 assists completion of packaging of two different packaging adhesives. When compared with the conventional method of using two different screen plates of different mesh sizes, the LED packaging method of the present invention simplifies LED package manufacturing process, raises LED package production efficiency, and reduces the related equipment cost. The effect of the present invention will be more apparent when employed to the fabrication of a more complicated package structure.

Figure 8:
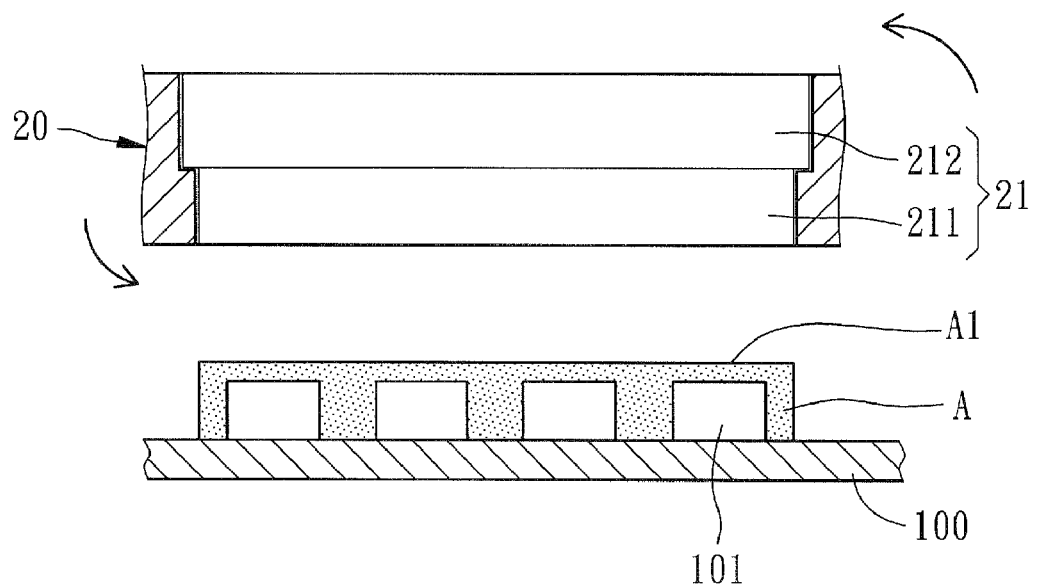
Figure 9:
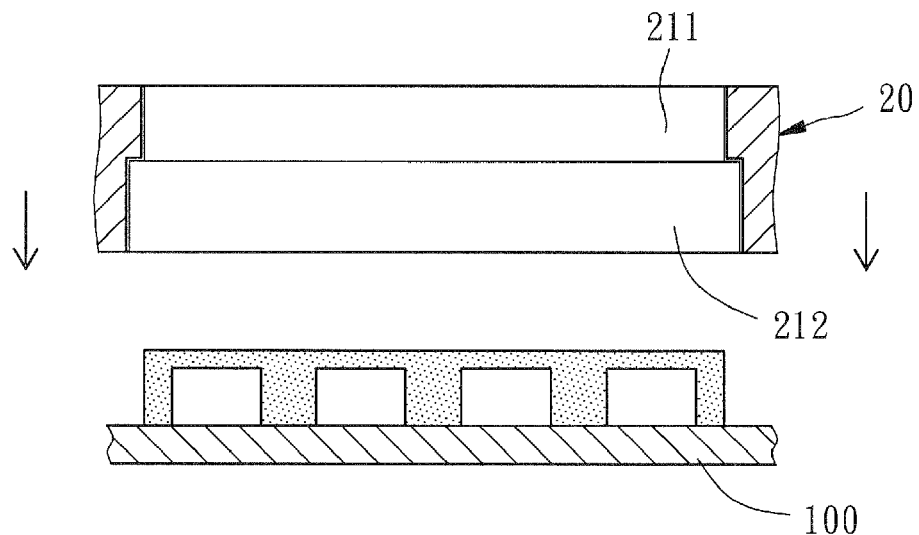
Figure 10:
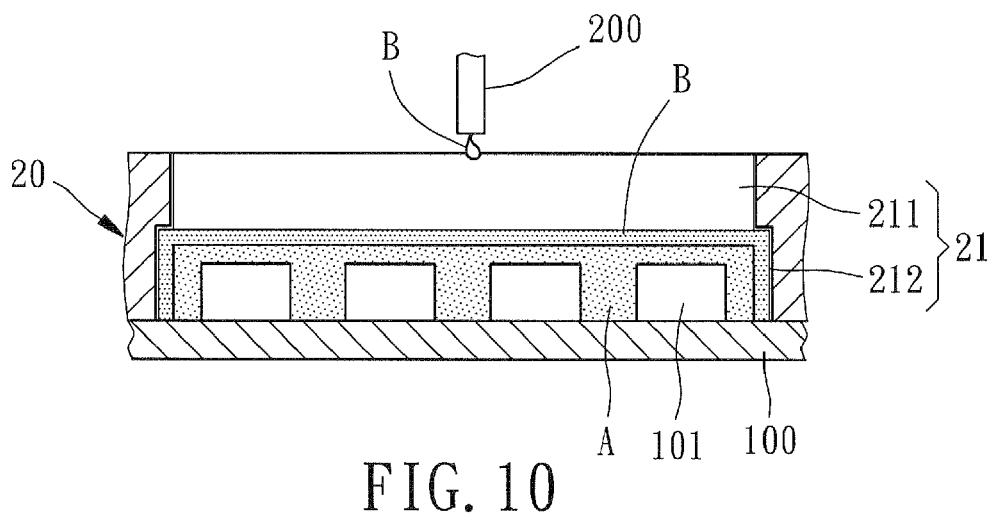
Figure 11:
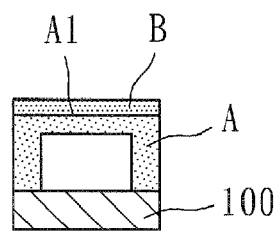
Figure 12:
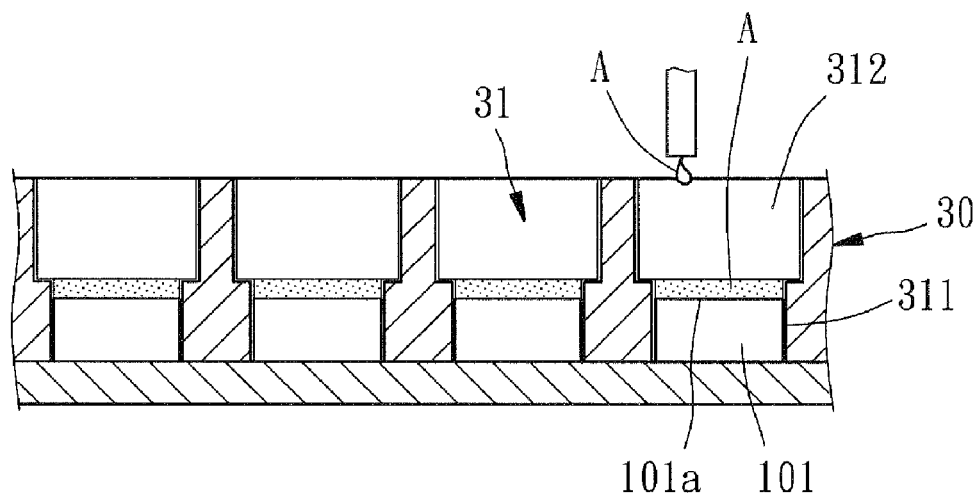
Figure 13:
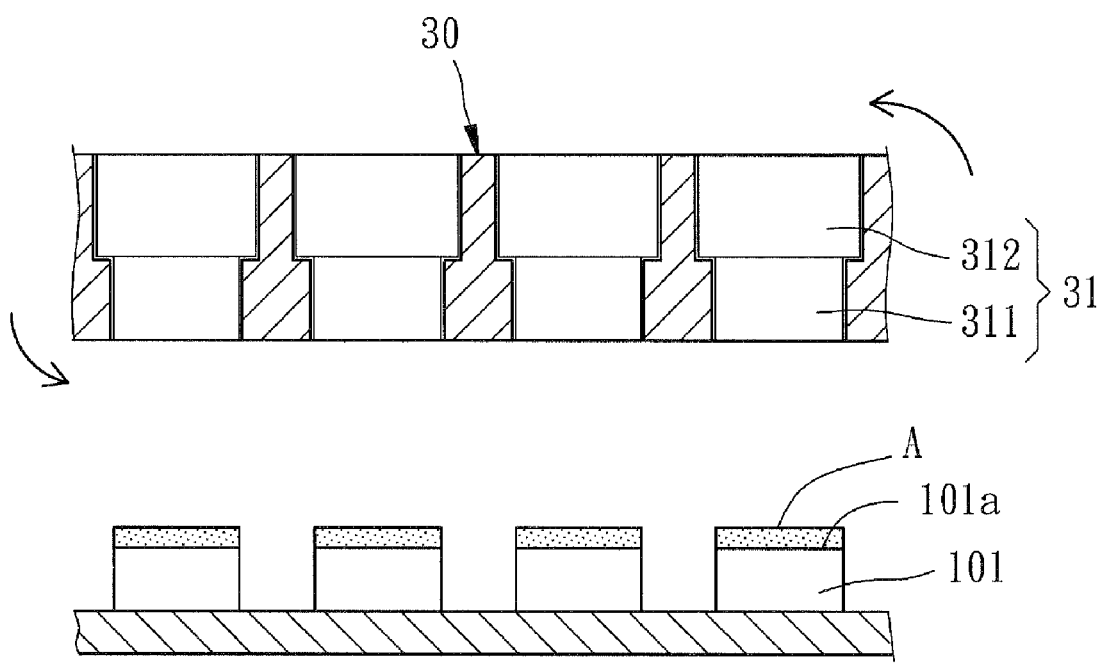
Figure 14:
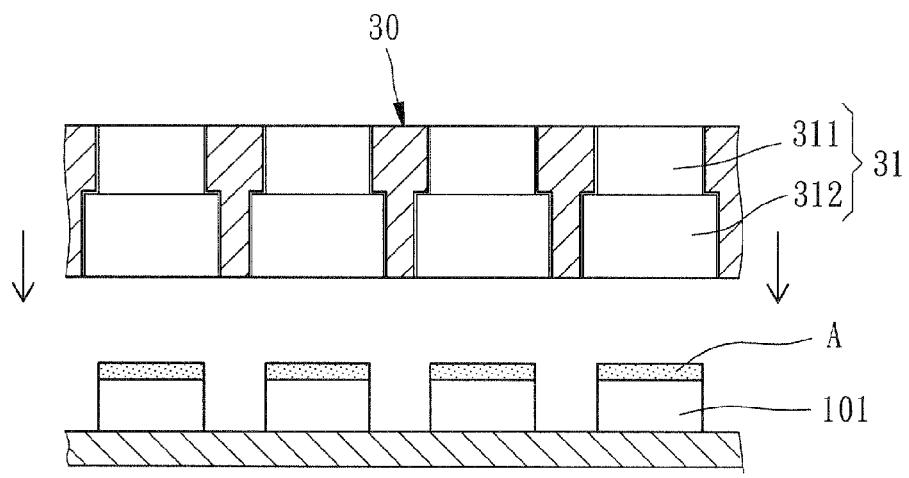
Figure 15:
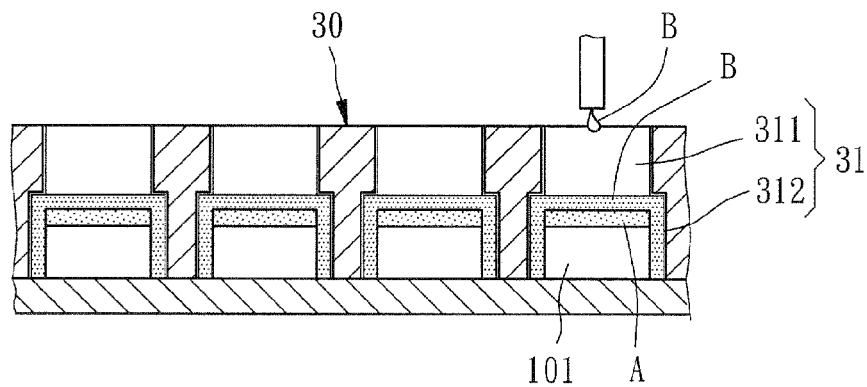

FIGS. 7~11 illustrate a LED packaging method using a screen plate 20 in accordance with a second embodiment of the present invention. This second embodiment is substantially similar to the aforesaid first embodiment with each stepped hole 21 is designed for the packaging of multiple LED chips 101. After the first packaging adhesive A has been applied to each stepped hole 21 to fill up the small diameter portion 211 of each stepped hole 21 and to cover the corresponding LED chips 101, a scraper 300 is used to level the applied first packaging adhesive A, further smoothing a surface A1 of the first packaging adhesive A and thus improving the light uniformity. Thereafter, as shown in FIGS. 8~10, cure the first packaging adhesive A, and then lift the screen plate 20 from the substrate 100, and then invert the screen plate 20 and lower the screen plate 20 to the substrate 100 again, and then operate the gluing machine 200 to apply the second packaging adhesive B, enabling the big diameter portion 212 of each stepped hole 21 to be filled with the second packaging adhesive B, and then apply a heating process to cure the second packaging adhesive B. After hardening of the second packaging adhesive B, a cutting procedure is employed, thereby obtaining finished LED packages, as shown in FIG. 11.

Figure 16:
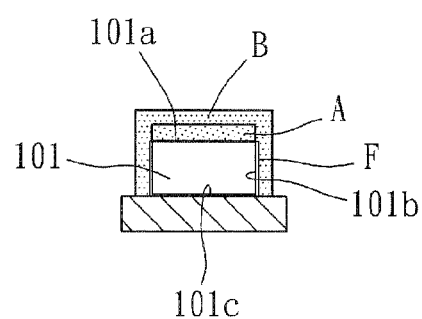
Figure 17:
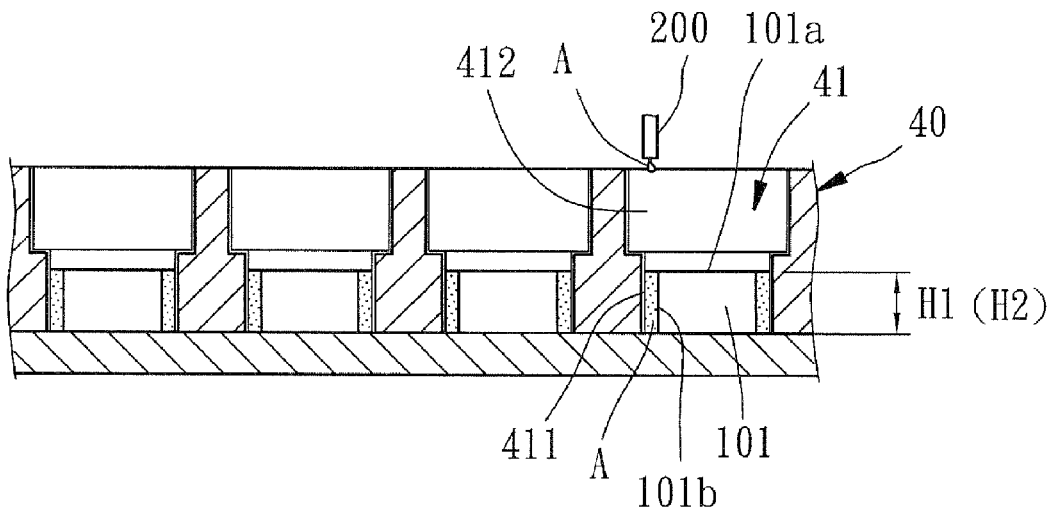
Figure 18:
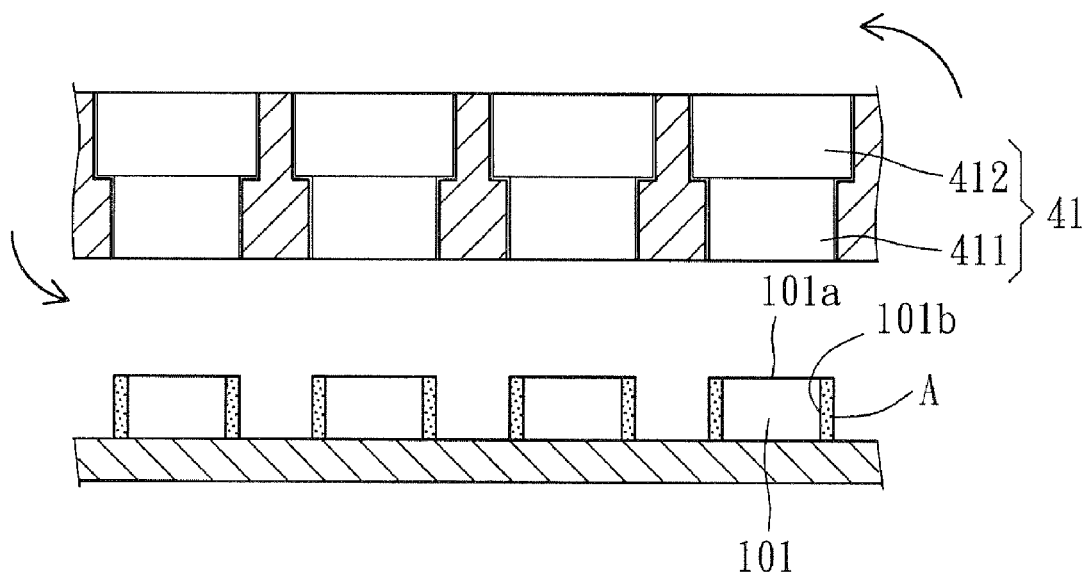
Figure 19:
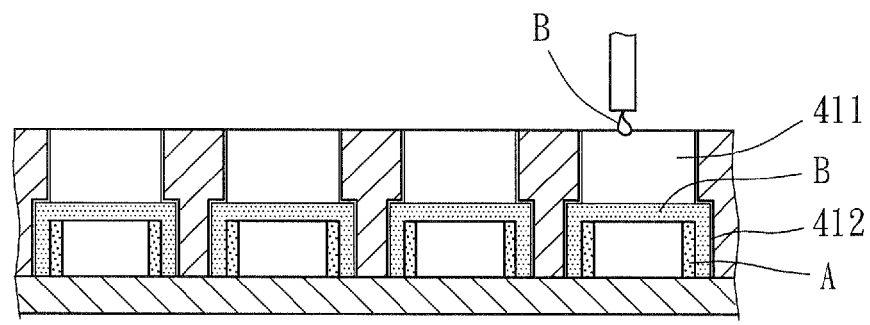

FIGS. 12~16 illustrate a LED packaging method using a screen plate 30 in accordance with a third embodiment of the present invention. This third embodiment is substantially similar to the aforesaid first embodiment with the exception that the small diameter portion 311 of each stepped hole 31 fits the size of one LED chip 101 such that the first packaging adhesive A covers only the top wall 101a of each LED chip 101 to satisfy top-view LED packaging requirement. After curing of the first packaging adhesive A, the screen plate 30 is reversed, and then the second packaging adhesive B is applied to the big diameter portion 312 of each stepped hole 31 to fill up the big diameter portion 312 of each stepped hole 31. After curing of the second packaging adhesive B, the packaged structure is cut into multiple individual LED packages, as shown in FIG. 16. It is to be understood that at least one of the periphery 101b and bottom wall 101c of each LED chip 101 is coated with a layer of reflective film F to raise the light extraction efficiency before start of the packaging procedure.

Figure 20:
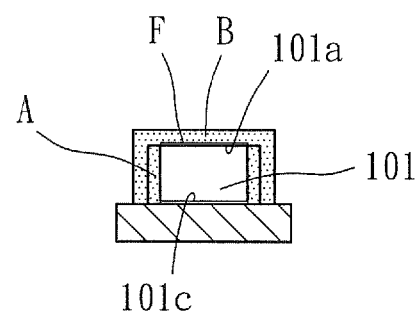

FIGS. 17~20 illustrate a LED packaging method using a screen plate 40 in accordance with a fourth embodiment of the present invention. This fourth embodiment is substantially similar to the aforesaid first embodiment with the exception that the application amount of the first packaging adhesive A is properly controlled such that the first packaging adhesive A covers on the periphery 101b of each LED chip 101 without touching the top wall 101a of each LED chip 101, i.e., the height H1 of the applied first packaging adhesive A is equal to or lower than the height H2 of each LED chip 101. This packaging procedure satisfies the requirement for side-view LED package. After curing of the first packaging adhesive A, the screen plate 40 is reversed, and then the second packaging adhesive B is applied to the big diameter portion 412 of each stepped hole 41 to fill up the big diameter portion 412 of each stepped hole 41. After curing of the second packaging adhesive B, the packaged structure is cut into multiple individual LED packages, as shown in FIG. 20. It is to be understood that at least one of the top wall 101a and bottom wall 101c of each LED chip 101 is coated with a layer of reflective film F to raise the light extraction efficiency before start of the packaging procedure.

Figure 21:
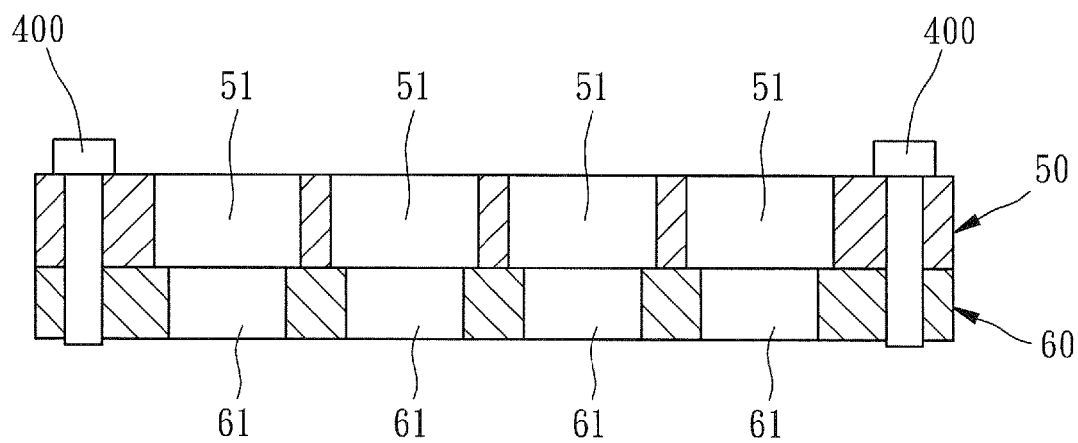
FIG. 21 is a sectional plain view showing a combination screen plate made in accordance with the present invention.

The aforesaid screen plate 10, 20, 30 or 40 can be an integrated member. Alternatively, as shown in FIG. 21, the screen plate can be a combination screen plate made by means of fixedly fastening a first screen plate 50 and a second screen plate 60 together with screw bolts 400, wherein the first screen plate 50 has a plurality of big diameter portions 51, and the second screen plate 60 has a plurality of small diameter portions 61 respectively kept in axial alignment with the big diameter portions 51 of the first screen plate 50.

Figure 22:
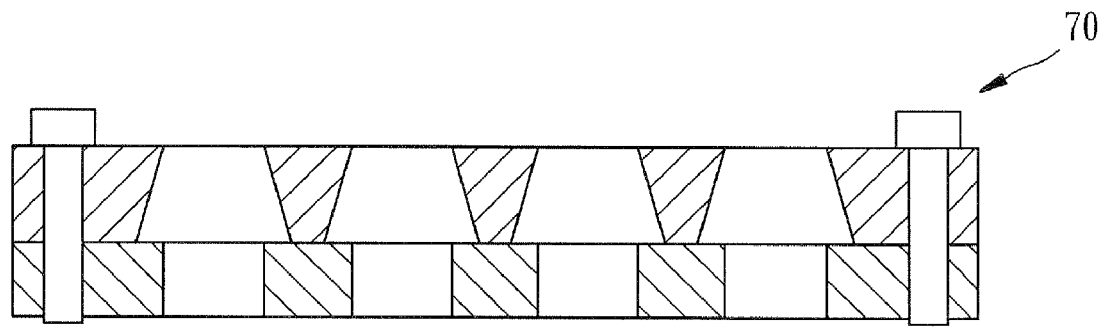
FIG. 22 is a sectional plain view, showing an alternate form of the combination screen plate according to the present invention.
Figure 23:
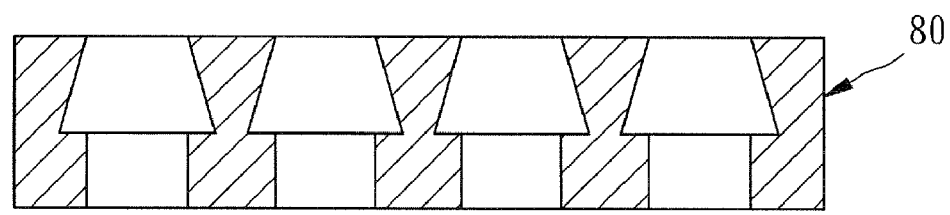
FIG. 23 is a sectional plain view, showing an alternate form of the screen plate according to the present invention.
Figure 24:
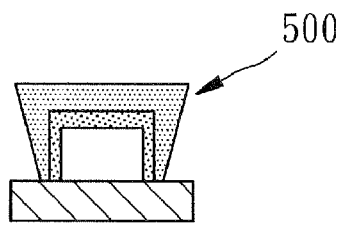
FIG. 24 is a sectional plain view of a LED package made subject to the use of the screen plate shown in FIG. 23.

Further, the small diameter portion and big diameter portion of each stepped hole of the integrated screen plate 80 (as shown in FIG. 23), or the big diameter portions and small diameter portions of the combination screen plate 70 (as shown in FIG. 22) can be made in any of a variety of shapes so that the finished LED package shows the desired shape (as shown in FIG. 24).

Further, the aforesaid first packaging adhesive A and second packaging adhesive B can be a same material. Further, the screen plate can be made having only one single stepped hole. The stepped hole is not limited to the two-step design as shown in the annexed drawings, i.e., it can be made having more than two steps.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A LED packaging method comprising a procedure of placing a screen plate having at least one stepped hole on a substrate carrying at least one LED chip, a procedure of reversing said screen plate with respect to said substrate, said at least one stepped hole having a big diameter portion and a small diameter portion, and a procedure of packaging said at least one LED chip with a first packaging adhesive by means of applying said first packaging adhesive to said small diameter portion of said at least one stepped hole and then packaging said first packaging adhesive and said at least one LED chip by means of applying a second packaging adhesive to said big diameter portion of said at least one stepped hole after said screen plate is reversed.

2. The LED packaging method as claimed in claim 1, wherein said at least one stepped hole of said screen plate is processed through a surface treatment to avoid said first packaging adhesive and said second packaging adhesive from sticking to the periphery of said at least one stepped hole.

3. The LED packaging method as claimed in claim 1, wherein said big diameter portion and small diameter portion of said at least one stepped hole are configured subject to a predetermined LED package shape.

4. The LED packaging method as claimed in claim 1, wherein said first packaging adhesive is applied to said at least one stepped hole to cover a surface of said at least one LED chip being received in said small diameter portion, and said second packaging adhesive is applied to the big diameter portion of said at least one stepped hole to cover a surface of the first packaging adhesive covering the periphery of said at least one LED chip being received in said big diameter portion.

5. The LED packaging method as claimed in claim 1, wherein said first packaging adhesive is applied to the small diameter portion of said at least one stepped hole to package said at least one LED chip being received in the small diameter portion, in such a manner that the applied first packaging adhesive in the small diameter portion of said at least one stepped hole is as higher as or higher than said at least one LED chip; said second packaging adhesive is applied to the big diameter portion of said at least one stepped hole to package said first package adhesive and said at least one LED chip in such a manner that the applied second packaging adhesive in the big diameter portion of said at least one stepped hole is higher than said at least one LED chip.

6. The LED packaging method as claimed in claim 1, wherein the small diameter portion of said at least one stepped hole of said screen plate is adapted for receiving one said LED chip.

7. The LED packaging method as claimed in claim 1, wherein the small diameter portion of said at least one stepped hole of said screen plate is adapted for receiving at least two said LED chips.

8. The LED packaging method as claimed in claim 7, further comprising a procedure of using a scraper to level said first packaging adhesive after packaging of said at least one LED chip with said first packaging adhesive and before application of said second packaging adhesive.

9. The LED packaging method as claimed in claim 1, wherein said screen plate is comprised of a first screen member and a second screen member arranged in a stack, said first screen member having the big diameter portion of said at least one stepped hole formed therein, said second screen member having the small diameter portion of said at least one stepped hole formed therein.

* * * * *